United States Patent
Herrmann

(10) Patent No.: US 8,564,007 B2
(45) Date of Patent: Oct. 22, 2013

(54) SEMICONDUCTOR COMPONENT COMPRISING AN OPTICALLY ACTIVE LAYER, ARRANGEMENT COMPRISING A MULTIPLICITY OF OPTICALLY ACTIVE LAYERS AND METHOD FOR PRODUCING A SEMICONDUCTOR COMPONENT

(75) Inventor: Siegfried Herrmann, Neukirchen (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 476 days.

(21) Appl. No.: 12/017,539

(22) Filed: Jan. 22, 2008

(65) Prior Publication Data
US 2008/0179622 A1 Jul. 31, 2008

(30) Foreign Application Priority Data

Jan. 31, 2007 (DE) .......... 10 2007 004 805
Apr. 11, 2007 (DE) .......... 10 2007 017 113

(51) Int. Cl.
*H01L 33/00* (2010.01)

(52) U.S. Cl.
USPC .................. 257/99; 257/E33.075

(58) Field of Classification Search
USPC ............. 257/99, 713, 714, E33.075
See application file for complete search history.

(56) References Cited

U.S. PATENT DOCUMENTS

| | | | |
|---|---|---|---|
| 3,508,100 A | 4/1970 | Tillays et al. | |
| 5,684,309 A | 11/1997 | McIntosh et al. | |
| 5,831,277 A | 11/1998 | Razeghi | |
| 6,172,382 B1 | 1/2001 | Nagahama et al. | |
| 6,480,515 B1 * | 11/2002 | Wilson | 372/36 |
| 6,849,881 B1 | 2/2005 | Harle et al. | |
| 7,016,383 B2 * | 3/2006 | Rice | 372/36 |
| 7,253,447 B2 | 8/2007 | Oishi et al. | |
| 2004/0075100 A1 | 4/2004 | Bogner et al. | |
| 2004/0125840 A1 * | 7/2004 | Jiang et al. | 372/46 |
| 2005/0158687 A1 * | 7/2005 | Dahm | 433/29 |
| 2005/0253252 A1 * | 11/2005 | Owen et al. | 257/714 |
| 2006/0076572 A1 | 4/2006 | Huber et al. | |
| 2007/0160097 A1 | 7/2007 | Behringer et al. | |
| 2008/0191236 A1 * | 8/2008 | De Graaf et al. | 257/99 |

FOREIGN PATENT DOCUMENTS

| | | |
|---|---|---|
| DE | 1 589 274 | 3/1970 |
| DE | 102 39 048 | 3/2003 |
| DE | 202 19 869 | 6/2003 |
| DE | 102004009998 | 9/2004 |
| DE | 102004004097 | 6/2005 |
| DE | 102005055293 | 2/2007 |
| DE | 102007004301 | 2/2008 |
| DE | 102007004303 | 2/2008 |
| EP | 1 643 188 | 4/2004 |
| EP | 1 703 121 | 9/2006 |

(Continued)

OTHER PUBLICATIONS

"Translation of the Notification of Reasons for Refusal (type I office action)", JP Pat. Appl. No. 2008-020227, issued on Jun. 11, 2012 (7 pages).

*Primary Examiner* — Wael Fahmy
*Assistant Examiner* — Sarah Salerno
(74) *Attorney, Agent, or Firm* — Fish & Richardson P.C.

(57) ABSTRACT

A semiconductor component comprising an optically active layer and characterized by at least one cooling element and at least one coupling element. Also disclosed is an arrangement comprising a multiplicity of optically active layers and a method for producing a semiconductor component.

18 Claims, 4 Drawing Sheets

(56) References Cited

FOREIGN PATENT DOCUMENTS

| FR | 2 739 983 | 4/1997 |
|----|-----------|--------|
| JP | 2005-5483 | 1/2005 |
| JP | 2005-294185 | 10/2005 |
| JP | 2006-237071 | 9/2006 |
| WO | WO 01/39282 | 5/2001 |
| WO | WO 02/084749 | 10/2002 |
| WO | WO 2006/114726 | 11/2006 |

* cited by examiner

SEMICONDUCTOR COMPONENT COMPRISING AN OPTICALLY ACTIVE LAYER, ARRANGEMENT COMPRISING A MULTIPLICITY OF OPTICALLY ACTIVE LAYERS AND METHOD FOR PRODUCING A SEMICONDUCTOR COMPONENT

CROSS REFERENCE TO RELATED APPLICATIONS

This application claims the benefit under Section 119 of foreign priority applications filed in Germany, serial number 10 2007 004 805.1, filed Jan. 31, 2007, and serial number 10 2007 017 113.9, filed Apr. 11, 2007. The contents of the prior applications are hereby incorporated by reference in their entirety

TECHNICAL FIELD

This disclosure relates to a semiconductor component comprising an optically active layer, particularly high-power light-emitting diodes. The disclosure is further directed to an arrangement comprising a multiplicity of optically active layers and a method for producing a semiconductor component.

BACKGROUND

A wide variety of semiconductor components comprising optically active layers are known. In particular, light-emitting diodes (LEDs for short) are used in a great many applications and arrangements for displaying operating states, and increasingly for general lighting purposes, as well. Other semiconductor components with active optical layers are also known, such as thin-film transistors (TFTs for short) for active matrix displays and laser diodes.

Although LEDs and other semiconductor components comprising active optical layers have a relatively high efficiency compared to conventional lighting devices such as incandescent or halogen lamps, the optically active layers release not only photoenergy, but also heat, which has the potential to damage or destroy the component. To eliminate this problem, either the power—of high-power components, in particular—must be sharply throttled or suitable cooling must be provided.

A housing suitable for an LED is known from US 2004/0075100 A1. This contains a leadframe and a separately produced thermal connecting part with a chip mounting area.

SUMMARY

One object of the present disclosure is to develop semiconductor components having an alternative construction that serves to dissipate heat generated in an optically active layer and is better suited for certain applications. A further intention is to describe an arrangement comprising a multiplicity of such semiconductor components and a method for producing them.

Disclosed herein is a semiconductor component comprising an optically active layer is described, which component is characterized by a cooling element for storing or dissipating heat generated by said optically active layer, and at least one coupling element that connects the optically active layer directly or indirectly to the cooling element.

By virtue of the thermally coupling of a cooling element to the optically active layer, the heat generated by the optically active layer can be dissipated or stored.

In a preferred configuration, the coupling element comprises at least one hollow space, said hollow space being partially or completely filled with a liquid coolant. The combination of an at least partially hollow coupling element with a liquid coolant contained therein makes it possible for heat generated in the optically active layer to be dissipated to a cooling element of the semiconductor component via a flow in the coolant, for example by convection, heat transport or a combination of vaporization and condensation. The use of convection instead of thermal conduction and the use of a liquid coolant permits greater flexibility in the design and placement of the coupling element and the cooling element.

According to one advantageous configuration, the optically active layer radiates electromagnetic radiation preferably in at least one radiation direction, the cooling element being disposed in a plane perpendicular to the radiation direction. Arranging the cooling element perpendicular to the radiation direction permits unimpeded radiation from the semiconductor component.

According to another configuration, the coupling element and the coolant are implemented as at least partially transparent and are disposed above the optically active layer in the radiation direction. The use of an at least partially transparent coupling element and a coolant makes it possible to dispose the coupling element above the optically active layer in the radiation direction in order as to dissipate the heat right where it arises, but without substantially hindering the emission of electromagnetic radiation.

According to a further preferred configuration, the semiconductor component is adapted to radiate electromagnetic radiation in two mutually opposite radiation directions, a respective, at least partially transparent coupling element being disposed on each of two mutually opposite sides of the optically active layer in each of the two radiation directions. This makes it possible to devise high-power semiconductor components that radiate from two sides.

An arrangement comprising a multiplicity of optically active layers is specified, which is characterized in that said multiplicity of optically active layers are thermally coupled to at least one coupling element having at least one hollow space, and at least one cooling element for storing or dissipating heat generated by the optically active layers is coupled to the at least one coupling element, said at least one hollow space being partially or completely filled with a liquid coolant.

According to a further advantageous configuration, the multiplicity of optically active layers is arranged in a grid shape. A grid-shaped arrangement of optically active layers makes flat displays and lighting systems possible.

According to a further advantageous configuration, a multiplicity of cooling elements surround the multiplicity of optically active layers at least partially in a grid, strip or ring shape. The use of a multiplicity of cooling elements that at least partially surround the multiplicity of optically active layers permits the effective cooling even of flat display and lighting systems.

Further described is a method for producing a semiconductor component, comprising the following steps:
  preparing at least one optically active layer,
  coupling the at least one optically active layer to a first coupling element comprising a hollow space,
  coupling at least one cooling element to the first coupling element, and
  partially or completely filling the hollow space with a liquid coolant.

Semiconductor components and arrangements comprising semiconductor components of the aforesaid kind can be produced by means of the above-listed steps.

According to a further advantageous configuration of the method, the at least one optically active layer is prepared on a substrate, the first coupling element is implemented as at least partially transparent, and after the at least one optically active layer is applied to the first coupling element, the substrate is removed from the optically active layer so light can be radiated through the optically active layer in the direction of the first coupling element and in the opposite direction.

A method improved in this fashion makes it possible to fabricate semiconductor components that permit two-sided light emission.

Further details and configurations are disclosed herein. Preferred embodiments are described in greater detail below on the basis of exemplary embodiments, with the aid of the following drawings.

DETAILED DESCRIPTION

Figure 1:
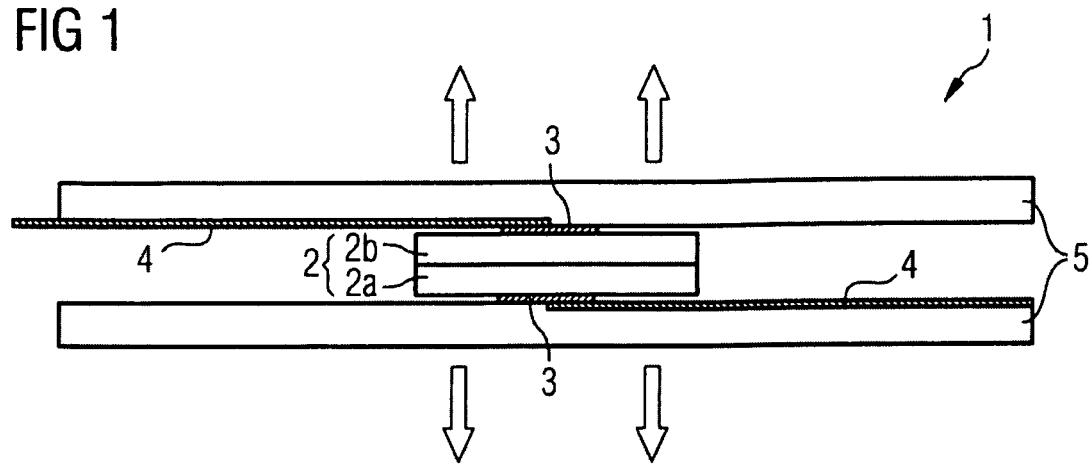
FIG. 1 shows a substrateless semiconductor component comprising an optically active layer and suitable for two-sided light emission.

FIG. 1 shows a semiconductor component 1 suitable for emitting light from two sides. It includes an optically active layer 2, which in the illustrated exemplary embodiment is composed of a lower sublayer 2a and an upper sublayer 2b. The lower sublayer 2a is a negatively doped indium gallium nitride layer, the upper sublayer 2b being, for example, a positively doped indium gallium nitride layer. Together, upper sublayer 2b and lower sublayer 2a form a pn junction having a band gap suitable for the generation of blue light, such that the optically active layer 2 as a whole functions as an LED.

Naturally, a person skilled in the art would be aware of a great many other semiconductor materials and structures suitable for emitting electromagnetic radiation of other wavelengths, including outside the visible spectrum. In general, the optically active layer has at least one active region suitable for generating electromagnetic radiation.

Nitride compound semiconductor materials are compound semiconductor materials that contain nitrogen, such as the aforementioned materials from the system $In_xAl_yGa_{1-x-y}N$, where $0 \leq x \leq 1$, $0 \leq y \leq 1$ and $x+y \leq 1$. In the present instance, the group of radiation-emitting and/or radiation-detecting semiconductor chips based on nitride compound semiconductor materials particularly includes such semiconductor chips in which the epitaxially produced semiconductor layer, which as a rule comprises a layer sequence composed of various single layers, comprises at least one single layer containing a material from the nitride compound semiconductor material system. The semiconductor layer can, for example, comprise a conventional pn junction, a double heterostructure, a single quantum well structure (SQW structure) or a multiple quantum well structure (MQW structure). Such structures are known to those skilled in the art and thus will not be described in more detail here. Examples of such MQW structures are described in the documents WO 01/39282, U.S. Pat. Nos. 6,172,382, 5,831,277 and 5,684,309, whose disclosure content in this regard is hereby incorporated by reference.

To deliver an operating current, lower sublayer 2a and upper sublayer 2b are each provided with a contact 3 and a lead 4. To protect optically active layer 2 against damage and optionally to connect it to a carrier, it is confined between two transparent films 5 disposed respectively on the top and bottom sides of the optically active layer 2. Compared to conventional LEDs, which are mounted on a non-light-transparent substrate, this creates the advantage that light can be emitted both upward and downward by the optically active layer 2.

In the semiconductor component 1 according to FIG. 1, the heat generated in the optically active layer 2 is dissipated via the transparent films 5.

Dissipation of the heat generated by an optically active layer 2 is advantageous not only in the case of semiconductor components that emit light from two sides, as depicted in FIG. 1. On the contrary, it also, in principle, enhances the performance of any other semiconductor component. This is especially important in the case of semiconductor components that generate a relatively large amount of heat in a very confined space. This also applies, in particular, to so-called chip arrays, i.e., arrangements comprising a multiplicity of semiconductor components, as will be described later on.

Figure 2:
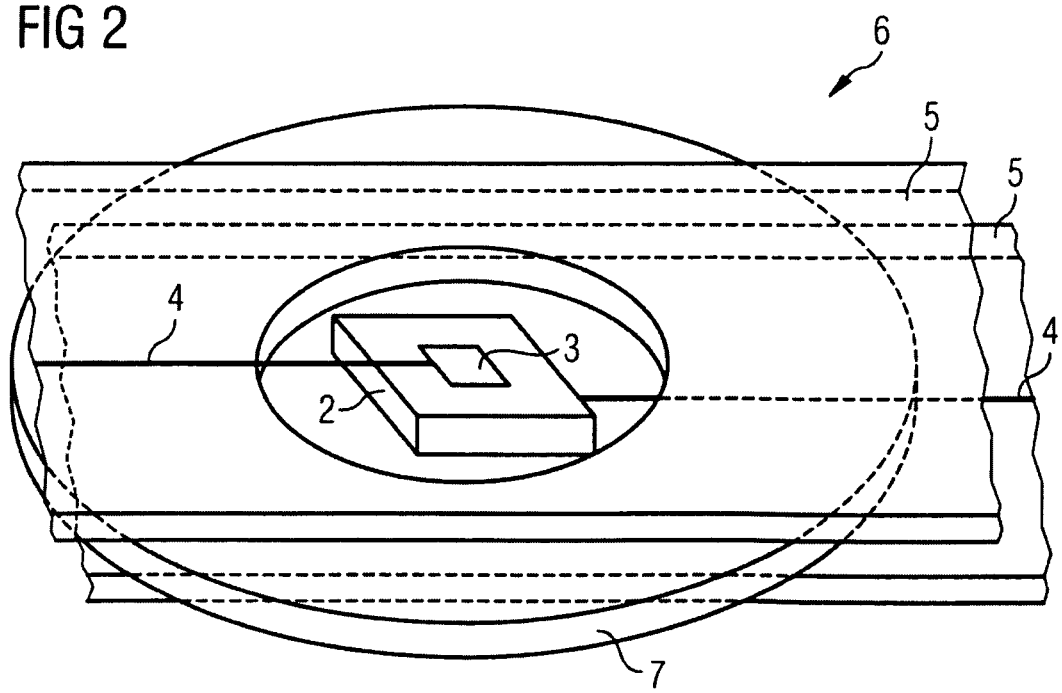
FIG. 2 shows an optically active layer surrounded by a ring-shaped cooling element for dissipating heat generated by the optically active layer.

FIG. 2 shows an improved design of a semiconductor component 6 for the purpose of dissipating heat generated in an optically active layer 2. To this end, optically active layer 2, which is constructed in an equivalent manner to the optically active layer 2 of FIG. 1, is surrounded by a ring-shaped cooling element 7. In the exemplary embodiment, the cooling element 7 essentially consists of a metal possessing high heat capacity and good thermal conductivity. However, a ceramic material or any other material having suitable thermal properties can be used instead of a metal.

To transfer heat from the optically active layer 2 to the cooling element 7, two transparent films 5 are used, one above and one below the optically active layer 2 and the cooling element 7.

Figure 3A:
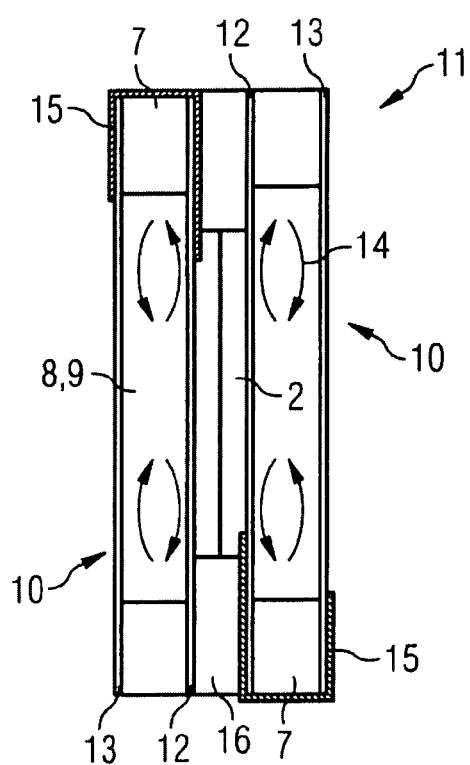
FIG. 3A shows a cross section through a semiconductor component comprising an optically active layer, a cooling element and two coupling elements.
Figure 3B:
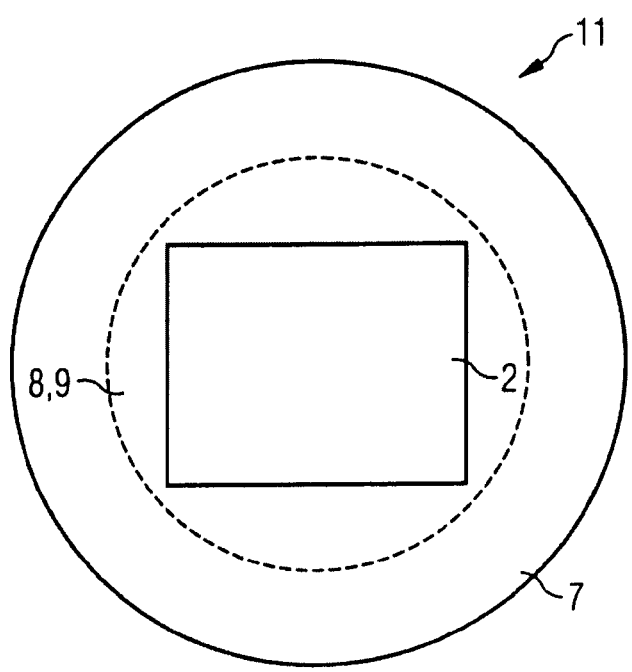
FIG. 3B shows a plan view of the semiconductor component according to FIG. 3A.

To improve thermal conduction from the optically active layer to the cooling element 7, in a further-improved exemplary embodiment, illustrated in FIGS. 3A and 3B, a liquid coolant 8 that is confined in a hollow space 9 of a coupling element 10 is used.

In the cross section of this exemplary embodiment depicted in FIG. 3A, a semiconductor component 11 includes an optically active layer 2 that is confined between two coupling elements 10. Each of these coupling elements 10 includes a first film 12, which faces the optically active layer 2, and a second film 13, which is located on the side of coupling element 10 facing away from the optical layer 2. Confined between first film 12 and second film 13 in each case is a respective cooling element 7, which simultaneously forms the outer boundary of the hollow space 9.

As illustrated by the arrows in the coupling elements 10 of FIG. 3A, the liquid coolant 8 heats up in the region of optically active layer 2 and cools back down in the region of cooling element 7. This results in a convective flow 14 that provides effective heat transport from optically active layer 2 to cooling element 7.

Suitable candidates for use as the coolant 8, depending on the application, are ethanol and ethanol-water mixtures, for example. Alcohol is non-toxic, low-viscosity and transparent and has a relatively high heat capacity and a low freezing point and is therefore suitable for outdoor and automotive applications, for example. Glycol additives, ethylene glycol additives and glycerine additives may also be used. Although water by itself has an even higher heat capacity, its relatively high melting point and anomalous nature make it more suitable for indoor applications.

In the exemplary embodiment, the leads 4 are run out to external contact areas 15, which serve to electrically connect the semiconductor component 11. The optically active layer 2 is confined by a solid body 16 that serves to position and protect the optically active layer 2 inside the semiconductor component 11. Mechanical stresses acting on the coupling element 10 and the cooling element 7 thus are not transmitted to the optically active layer 2, but to the solid body 16.

The semiconductor component 11 is illustrated in plan in FIG. 3B. It can be seen therein that the cooling element 7 is implemented as a ring around the optically active layer 2. Any other geometry can, of course, be chosen for the cooling element 7, for example a square enclosure.

Figure 4:
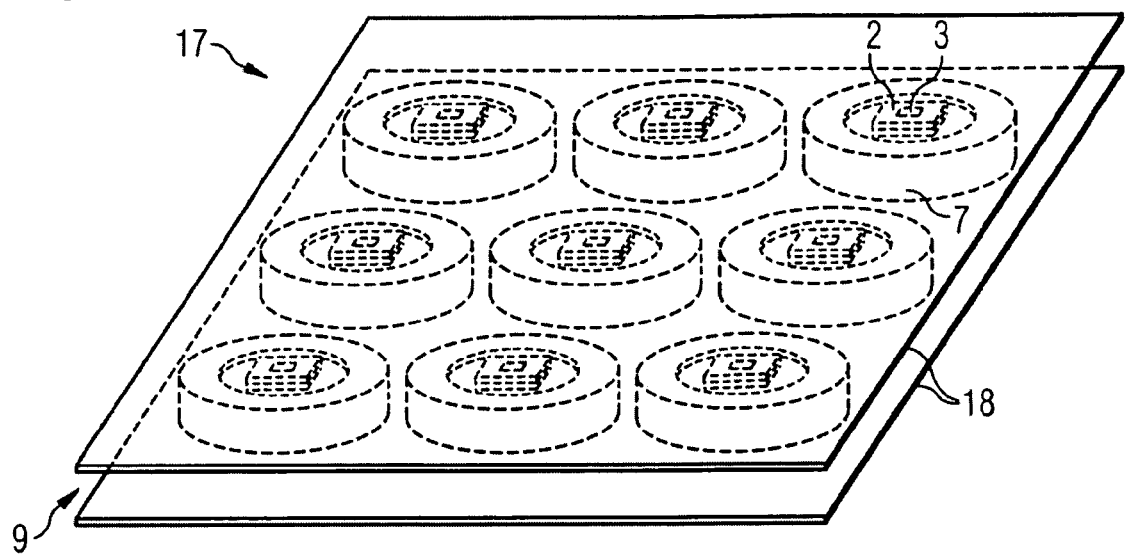
FIG. 4 shows an arrangement comprising a multiplicity of semiconductor components.

In individual semiconductor components 11 of the kind illustrated in FIGS. 3A and 3B, the ring-shaped cooling element 7 serves to create an especially advantageous component symmetry. In other semiconductor components, however, especially those in which optically active layers 2 are arranged in a grid shape, it may useful for the cooling element or elements 7 also to be in the form of a grid or in the form of cooling strips or cooling fins. FIG. 4 shows an arrangement 17 comprising a multiplicity of optically active layers 2. The individual optically active layers 2 here are analogous to, for example, the optically active layer 2 depicted in FIG. 1. In arrangement 17, nine optically active layers 2 with contacts 3 and leads 4, together with a cooling element 7, are confined between two common films 18 that function as a coupling element 10. Arrangement 17 thus emits light both areally and on both sides of the films 18, thus permitting particularly advantageous illumination of the surrounding space.

To improve cooling, the hollow space 9 between the films 18 is filled with a coolant 8. To the extent that the coolant 8 is electrically conductive and comes into direct contact with the optically active layers 2, the contacts 3 or the leads 4, the latter elements must be electrically isolated by suitable measures. For example, optically active layer 2 can be provided with a transparent oxide layer, such as an indium tin oxide (ITO) layer.

In an alternative configuration, one or more hollow spaces 9 that can be used to cool the optically active layers 2 can be provided within the films 18 in the region of the individual optically active layers 2. According to another configuration, one or more hollow spaces 9 serving to cool all the optically active layers 2 in common are arranged over the films 18.

Figure 5:
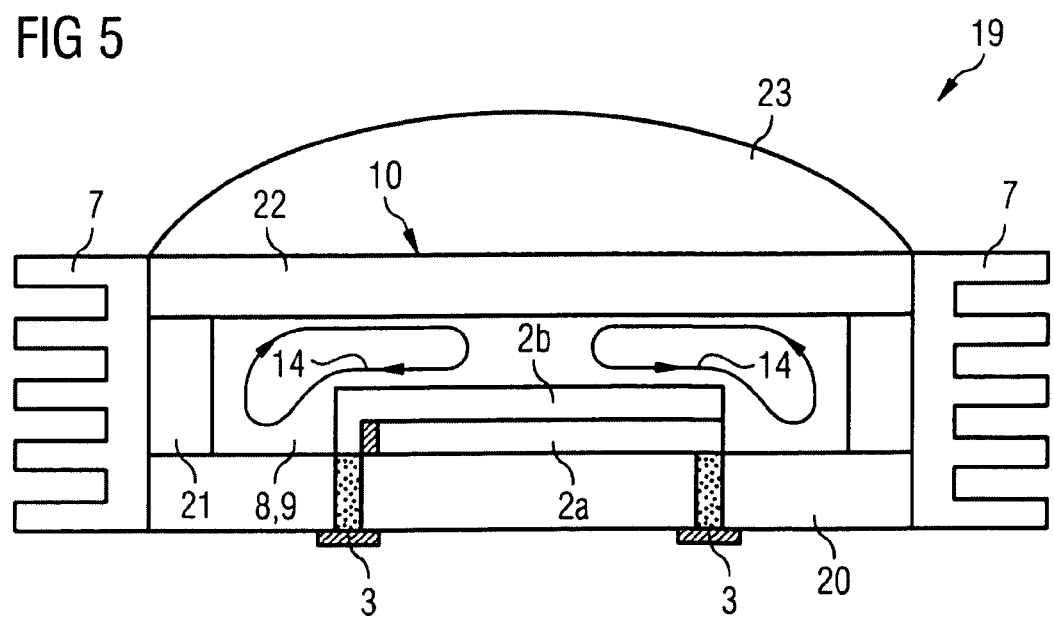
FIG. 5 shows a semiconductor component comprising an optically active layer disposed on a substrate.

The above-described cooling concept can also, of course, be used in other semiconductor components comprising optically active layers. FIG. 5 shows another example of a semiconductor component 19 suitable for radiating from only one side. In this exemplary embodiment, the semiconductor component 19 is a particularly high-power LED used in the automotive industry.

Formed on a substrate 20 is an optically active layer 2 composed of a lower layer 2a and an upper layer 2b, which taken together yield a diode structure. Lower sublayer 2a and upper sublayer 2b can be supplied with an operating voltage via contacts 3.

In the exemplary embodiment, optically active layer 2 is an especially high-power diode structure, which cannot be cooled solely by thermal conduction through the substrate 20. Spacers 21 are therefore additionally arranged on the substrate 20, and these, in cooperation with a cover glass 22, form a hollow space 9 in the region of the optically active layer 2. The hollow space 9 is filled with a transparent liquid coolant 8, so that during the operation of the semiconductor component 19 a convective flow 14 develops in the liquid coolant 8. In this way, the heat generated in the optically active layer 2 is first dissipated to the spacer 21 and the cover glass 22. Together, substrate 20, spacer 21 and cover glass 22, with the hollow space 9 and the coolant liquid 8 present therein, form a coupling element 10.

It is generally possible to completely surround the optically active layer 2 with the coupling element 10 or the liquid coolant 8 so as to ensure heat dissipation on all sides.

To improve cooling efficiency, disposed on the respective outer faces of the spacers 21 are additional cooling elements 7 that further dissipate the heat given off by the spacers 21. These cooling elements 7 can, for example, be a housing wall or cooling fins of the component 19.

To improve optical performance, particularly in order to bundle the light emitted by optically active layer 2, an optical element 23 is disposed on the cover glass 22. This can be, for example, a lens optic or prism optic that produces a radiation profile suited to the application, such as, for example, the light cone of an automobile headlight.

As is apparent from FIG. 5, the cooling element 7 can be placed in a much more flexible manner than in conventional arrangements, where it is usually disposed on the back of the substrate 20. As a further advantage, the substrate 20 and any other components or layers of the semiconductor component 19 that may be present are exposed to less thermal stress, so their life span increases.

To further increase cooling efficiency, the liquid coolant 8 can also be driven through the hollow space 9 by the action of external forces. Especially in the case of relatively large arrangements, forced cooling by means of a pump can be implemented to increase liquid throughput.

Figure 6A:
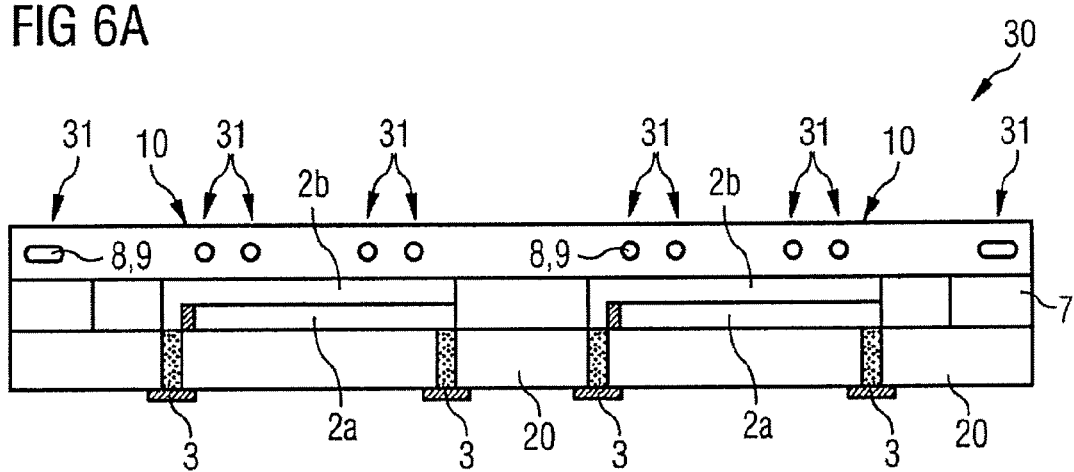
FIG. 6A shows a cross section through another configuration of a semiconductor component.
Figure 6B:
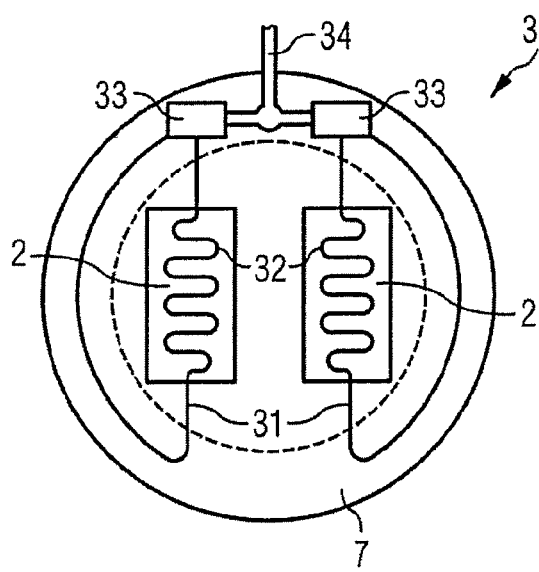
FIG. 6B shows a plan view of the semiconductor component according to FIG. 6A.

FIGS. 6A and 6B show a further configuration of a semiconductor component 30.

Semiconductor component 30 includes two optically active layers 2, each comprising a lower and an upper sublayer, respectively 2a and 2b. The optically active layers 2 are disposed on a substrate 20 and are supplied with an operating voltage via contacts 3.

In addition, the optically active layers 2 are connected to a ring-shaped cooling element 7 via a common coupling element 10, in the exemplary embodiment a structured transparent layer containing microcavities 31. In contrast to the preceding exemplary embodiment, here the liquid coolant 8 flows only through the microcavities 31, which constitute the hollow spaces 9 in the coupling element 10. There is no direct contact between the liquid coolant 8 and the optically active layer 2.

FIG. 6B shows a plan view of the semiconductor component 30 with two optically active layers 2. It can be seen in this plan view that the microcavities 31 form cooling serpentines 32 in the region of the optically active layers 2. By means of micropumps 33, the liquid coolant 8 is pumped through the cooling serpentines 32 and then through the continuation of the microcavities 31 in the region of cooling element 7. Also disposed in the region of cooling element 7 is an equalizing vessel 34 that serves to relieve pressure in the cooling circuit during intense heating or cooling.

Figure 6C:
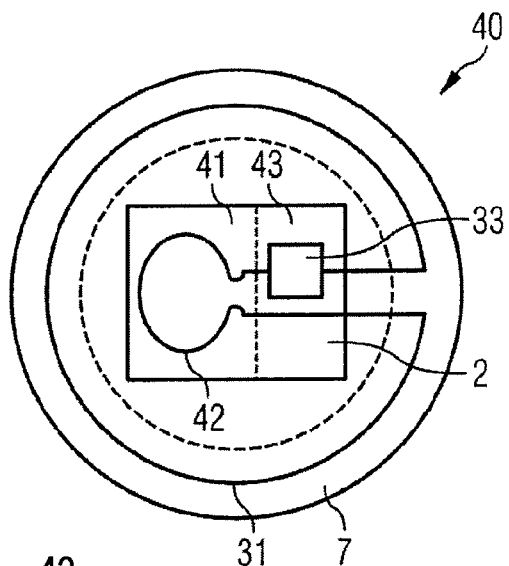
FIG. 6C shows a plan view of another configuration of a semiconductor component.
Figure 6D:
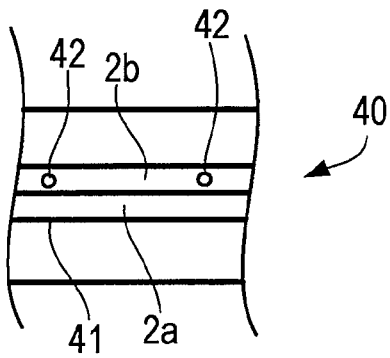
FIG. 6D shows a cross-section of FIG. 6C in region 41 and parallel to the dashed separation line between regions 41 and 43 of FIG. 6C.

FIG. 6C shows another configuration of a semiconductor component 40.

In semiconductor component 40, microcavities 31 are integrated directly into the substrate 20 or the optically active layer 2 of the semiconductor component 40. This makes sense especially when only a portion of the optically active layer 2 actually emits light, whereas other portions of the optically active layer 2 contain additional semiconductor components.

In the exemplary embodiment illustrated in FIG. 6C, a first region 41 of the optically active layer 2 is adapted, for example by suitable doping, etching or other semiconductor processing techniques, to emit electromagnetic radiation. At the same time, disposed in the first region 41 is a cooling coil 42 in the form of a microcavity 31 that enables heat to be dissipated right where it arises.

Disposed in a second region 43 of optically active layer 2 is a micropump 33 that sends a liquid coolant 8 through the cooling coil 42. After the liquid coolant 8 has passed through cooling coil 42, it flows back through microcavity 31 in the region of a cooling element 7 annularly surrounding optically active layer 2 and relinquishes the heat absorbed from optically active layer 2. The micropump 33 or the control electronics necessary for its operation can be integrated directly into optically active layer 2 or a substrate 20 located thereunder.

If the hollow space 9 or the liquid coolant 8 covers only portions of optically active layer 2 or is located at the edge of the optical path, as illustrated for example in FIG. 6C, a non-transparent liquid coolant 8 can be used. The walls of the hollow space 9 need not be made of a transparent material either in that case.

It is also possible to surround one or more optically active layers with a ring-shaped hollow space 9 filled with a liquid coolant 8 for cooling the optically active layer. For example, the left-over hollow space between the optically active layer 2 and the cooling element 7 according to FIG. 6C can also be used to create a flow of coolant.

Alternatively, a so-called heatpipe can also be used as a coupling element 10 for purposes of better and faster heat dissipation. Heatpipes are suitable particularly in arrangements in which the distance between the semiconductor component and the cooling element 7 is relatively large. A heatpipe contains a hollow space 9 partially filled with a liquid coolant 8. A low pressure prevails in the heatpipe, so the coolant 8 vaporizes in the region of a heat source even in the presence of a slight temperature increase. The gaseous coolant 8 passes through the heatpipe and on to a region of the cooling element 7 where it relinquishes the absorbed heat by condensation. The liquid coolant 8 then travels back to the region of the heat source, for example through the use of a wick or a capillary or simply by the force of gravity.

In a further advantageous configuration, a refrigerating machine is used for active cooling, for example in the form of a compression refrigerating machine. For this purpose, an initially gaseous coolant 8, for example a hydrocarbon compound, is compressed by means of a compressor and thus liquefied in a condenser in the vicinity of the cooling element 7, heat being given off in the process. Via a throttle, for example in the form of a capillary tube, the then-liquid coolant 8 is channeled into the hollow space 9, the pressure in the condenser being higher than the pressure in the hollow space 9. The hollow space 9 thus functions as a vaporizer and cools the optically active layer 2 by absorbing heat. The regasified coolant 8 is then compressed again, creating a closed cooling circuit.

The invention is not limited to the exemplary embodiments by the description of it with reference thereto. Rather, the invention encompasses any novel feature and any combination of features, including in particular any combination of features recited in the claims, even if that feature or combination itself is not explicitly mentioned in the claims or exemplary embodiments.

What is claimed is:

1. A semiconductor component comprising:
   an optically active layer operable to radiate electromagnetic radiation in at least one radiation direction,
   at least one cooling element for storing or dissipating heat generated by said optically active layer substantially annularly enclosing said optically active layer in a plane that is perpendicular to a radiation direction, and
   at least one coupling element that connects said optically active layer to said cooling element;
   wherein the at least one coupling element comprises at least one hollow space disposed above said optically active layer in the radiation direction, said at least one hollow space being partially or completely filled with a liquid coolant and configured to be flowed through by the liquid coolant,
   wherein a portion of said at least one hollow space is disposed above said optically active layer in the radiation direction so that the radiation at least partially passes the liquid coolant, and
   wherein a portion of said at least one hollow space is disposed in a substantially annular region above the cooling element in the radiation direction.

2. The semiconductor component as in claim 1, and said at least one cooling element being disposed in a plane that is perpendicular to said radiation direction.

3. The semiconductor component as in claim 2, wherein said at least one cooling element at least partially encloses said optically active layer in said perpendicular plane.

4. The semiconductor component as in claim 2, wherein said at least one coupling element is at least partially transparent and is disposed above said optically active layer in the radiation direction.

5. The semiconductor component as in claim 4, wherein said semiconductor component is configured to radiate electromagnetic radiation in two mutually opposite radiation directions.

6. The semiconductor component as in claim 5, wherein a respective transparent coupling element is disposed on each of two mutually opposite sides of said optically active layer in each of said two radiation directions.

7. The semiconductor component as in claim 1, wherein said optically active layer is disposed on a substrate and during operation electromagnetic radiation radiates perpendicularly to a surface of said substrate.

8. The semiconductor component as in claim 1, wherein said coupling element comprises at least one transparent film, which is disposed on said optically active layer.

9. The semiconductor component as in claim 1, wherein said cooling element is ring-shaped.

10. The semiconductor component as in claim 1, wherein said cooling element comprises a metallic and/or ceramic material.

11. The semiconductor component as in claim 1, wherein said semiconductor component comprises an active cooling circuit and is configured to vaporize said liquid coolant in at least a portion of said at least one hollow space.

12. The semiconductor component as in claim 1, wherein said coupling element includes a heat-conducting pipe that is partially filled with said liquid coolant.

13. The semiconductor component as in claim 1, wherein said liquid coolant is configured to be pumped through said at least one hollow space.

14. An arrangement comprising:
a semiconductor component according to claim 1, wherein the optically active layer is
a multiplicity of optically active layers thermally connected to said at least one coupling element comprising at least one hollow space,
wherein said optically active layers radiate electromagnetic radiation in at least one radiation direction, and
wherein the liquid coolant is disposed above said optically layers in the radiation direction, so that the radiation at least partially passes the liquid coolant.

15. The arrangement as in claim 14, wherein said multiplicity of optically active layers is arranged in a grid shape.

16. The arrangement as in claim 14, further comprising a multiplicity of cooling elements surrounding said multiplicity of optically active layers at least partially in a grid, strip or ring shape.

17. The arrangement as in claim 14, wherein said at least one coupling element is at least partially transparent.

18. A semiconductor component comprising
an optically active layer operable to radiate electromagnetic radiation in at least one radiation direction;
at least one cooling element for storing or dissipating heat generated by said optically active layer substantially annularly enclosing said optically active layer in a plane that is perpendicular to a radiation direction, and
at least one coupling element that connects said optically active layer to said cooling element;
wherein the at least one coupling element comprises at least one hollow space disposed above said optically active layer in the radiation direction, said at least one hollow space being partially or completely filled with a liquid coolant and configured to be flowed through by the liquid coolant,
wherein a portion of said at least one hollow space is disposed above said optically active layer in the radiation direction, so that the radiation at least partially passes the liquid coolant,
wherein said semiconductor component comprises an active cooling circuit and is configured to vaporize said liquid coolant in said at least one hollow space, and
wherein a portion of said at least one hollow space is disposed in a substantially annular region above the cooling element in the radiation direction.

* * * * *